(12) United States Patent
Sun et al.

(10) Patent No.: US 11,557,638 B2
(45) Date of Patent: Jan. 17, 2023

(54) ARRAY SUBSTRATE HAVING LIGHT-SHIELDING PORTION AND DISPLAY PANEL

(71) Applicant: BOE TECHNOLOGY GROUP CO., LTD., Beijing (CN)

(72) Inventors: Hongda Sun, Beijing (CN); Fengjuan Liu, Beijing (CN); Wei Liu, Beijing (CN); Jianye Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 16/908,913

(22) Filed: Jun. 23, 2020

(65) Prior Publication Data

US 2020/0411622 A1 Dec. 31, 2020

(30) Foreign Application Priority Data

Jun. 27, 2019 (CN) .......................... 201910567291.5

(51) Int. Cl.
H01L 27/14 (2006.01)
H01L 27/32 (2006.01)
H01L 27/12 (2006.01)

(52) U.S. Cl.
CPC ...... H01L 27/3265 (2013.01); H01L 27/3258 (2013.01); H01L 27/3272 (2013.01);
(Continued)

(58) Field of Classification Search
CPC ............. H01L 27/3265; H01L 27/3258; H01L 27/3262; H01L 27/3276; H01L 27/1255; H01L 2227/323
(Continued)

(56) References Cited

U.S. PATENT DOCUMENTS 9,502,604 B2 11/2016 Kwon et al.
9,620,577 B2 4/2017 Choi et al.
(Continued)

FOREIGN PATENT DOCUMENTS

CN 107887413 4/2018
CN 108091673 5/2018
(Continued)

OTHER PUBLICATIONS

Chinese Office Action dated Feb. 3, 2021 corresponding to European Patent Application No. 201910567291.5; 27 pages.

*Primary Examiner* — Phuc T Dang
(74) *Attorney, Agent, or Firm* — Leason Ellis LLP

(57) ABSTRACT

An array substrate, a display panel including the array substrate, and a fabrication method of the array substrate are provided. The array substrate includes a base substrate, a light-shielding portion, a thin-film transistor and a capacitor. The light-shielding portion is formed on a first surface of the base substrate. The thin-film transistor is formed on a side of the light-shielding portion away from the base substrate, and includes an active layer. The capacitor is formed on the first surface of the base substrate, and includes a first capacitive electrode and a second capacitive electrode. The first capacitive electrode and the second capacitive electrode are at least partially arranged opposite to each other in a direction perpendicular to the first surface of the base substrate. The first capacitive electrode is provided in a same layer as the light-shielding portion.

17 Claims, 5 Drawing Sheets

(52) U.S. Cl.
CPC ...... *H01L 27/3276* (2013.01); *H01L 27/1255* (2013.01); *H01L 2227/323* (2013.01)

(58) Field of Classification Search
USPC .......................................................... 257/72
See application file for complete search history.

(56) References Cited

U.S. PATENT DOCUMENTS

| | | | |
|---|---|---|---|
| 10,297,617 | B2 | 5/2019 | Yang et al. |
| 10,720,484 | B2 | 7/2020 | Zhang et al. |
| 2008/0143255 | A1 | 6/2008 | Lee et al. |
| 2013/0270527 | A1* | 10/2013 | Kwon ...................... H01L 29/24 |
| | | | 254/43 |
| 2015/0243722 | A1* | 8/2015 | Kwon .................. H01L 27/3265 |
| | | | 257/40 |
| 2018/0061908 | A1* | 3/2018 | Shim ........................ G09G 3/32 |
| 2018/0175077 | A1* | 6/2018 | Koo ...................... H01L 27/127 |
| 2019/0131365 | A1* | 5/2019 | Jung .................. H01L 27/3262 |
| 2019/0131369 | A1* | 5/2019 | Choi .................. H01L 29/78633 |
| 2020/0312831 | A1 | 10/2020 | He et al. |

FOREIGN PATENT DOCUMENTS

| | | |
|---|---|---|
| CN | 109378326 | 2/2019 |
| CN | 109585520 | 4/2019 |
| CN | 109859647 | 6/2019 |

\* cited by examiner

ARRAY SUBSTRATE HAVING LIGHT-SHIELDING PORTION AND DISPLAY PANEL

CROSS-REFERENCE TO RELATED APPLICATIONS

For all purposes under the U.S. law, the present application claims priority of Chinese Patent Application No. 201910567291.5 filed on Jun. 27, 2019, the disclosure of which is incorporated herein by reference in its entirety as part of the present application.

TECHNICAL FIELD

Embodiments of the present disclosure relate to an array substrate, a display panel including the array substrate, and a fabrication method of the array substrate.

BACKGROUND

An array substrate used for a display panel generally includes a display region within a display unit; and the display unit includes a plurality of pixels, and can display an image through a combination of light emitted by the respective pixels. Each pixel includes a pixel circuit and a light emitting element, such as an Organic Light-Emitting Diode (OLED). The pixel circuit includes a storing capacitor and a driving transistor, and can control light emission from the light emitting element.

SUMMARY

At least some of the embodiments of the present disclosure provides an array substrate including a base substrate, a light-shielding portion, a thin-film transistor and a capacitor. The light-shielding portion is formed on a first surface of the base substrate. The thin-film transistor is formed on a side of the light-shielding portion away from the base substrate, and includes an active layer. The capacitor is formed on the first surface of the base substrate, and includes a first capacitive electrode and a second capacitive electrode. The first capacitive electrode and the second capacitive electrode are at least partially arranged opposite to each other in a direction perpendicular to the first surface of the base substrate. The first capacitive electrode is provided in a same layer as the light-shielding portion. And, at least a portion of an orthogonal projection of the active layer on the first surface of the base substrate is located in an orthogonal projection of the light-shielding portion on the first surface of the base substrate.

For example, in some of the embodiments, the first capacitive electrode is formed of a same conductive material as the light-shielding portion.

For example, in some of the embodiments, the second capacitive electrode is provided in a same layer as the active layer, and is formed from a same material as the active layer.

For example, in some of the embodiments, the thin-film transistor further includes a gate electrode, and the second capacitive electrode is provided in a same layer as the gate electrode, and is formed from a same material as the gate electrode.

For example, in some of the embodiments, the array substrate further includes a third electrode. The thin-film transistor further includes a source-drain electrode, the third electrode is provided in a same layer as the source-drain electrode, and is formed from a same material as the source-drain electrode. The third electrode is electrically connected to the first capacitive electrode through a first via hole.

For example, in some of the embodiments, the third electrode is at least partially opposite to the second capacitive electrode in the direction perpendicular to the first surface of the base substrate.

For example, in some of the embodiments, the array substrate further includes a power line. The third electrode is provided in a same layer and formed from a same material as the power line, and the third electrode is electrically connected to the power line.

For example, in some of the embodiments, the array substrate further includes a gate line, a data line and a power line. The gate line and the data line is respectively electrically connected with the thin-film transistor. The power line is electrically connected with the first capacitive electrode or the second capacitive electrode. An orthogonal projection of at least one of the first capacitive electrode and the second capacitive electrode on the first surface of the base substrate at least partially overlaps with an orthogonal projection of at least one of the gate line, the data line, and the power line on the first surface of the base substrate.

For example, in some of the embodiments, the first capacitive electrode includes a first complementary portion; the second capacitive electrode includes a second complementary portion. A shape of a projection of the first complementary portion on the first surface of the base substrate is complementary to a shape of a projection of the second complementary portion on the first surface of the base substrate.

For example, in some of the embodiments, the thin-film transistor further includes a gate electrode and a source-drain electrode. The array substrate further includes an inter-layer dielectric layer. The inter-layer dielectric layer is provided on a side of the active layer, the gate electrode, and the second capacitive electrode that is away from the base substrate, and includes a source-drain electrode via hole. The source-drain electrode is formed on a side of the inter-layer dielectric layer that is away from the base substrate, and is electrically connected with the active layer through the source-drain electrode via hole.

For example, in some of the embodiments, the inter-layer dielectric layer includes a first dielectric layer sub-portion and a second dielectric layer sub-portion. An orthogonal projection of the gate electrode on the first surface of the base substrate is within an orthogonal projection of the first dielectric layer sub-portion on the first surface of the base substrate. An orthogonal projection of the second dielectric layer sub-portion on the first surface of the base substrate does not overlap with the orthogonal projection of the gate electrode on the first surface of the base substrate. The first dielectric layer sub-portion has a first thickness. And, the second dielectric layer sub-portion has a second thickness, and the first thickness is smaller than the second thickness.

For example, in some of the embodiments, the array substrate further includes a planarization layer, provided on a side of the inter-layer dielectric layer, the source-drain electrode, and the third electrode that is away from the base substrate.

For example, in some of the embodiments, the array substrate further includes a light emitting element, formed on a side of the planarization layer that is away from the base substrate. The planarization layer includes a second via hole, and the light emitting element is electrically connected with the source-drain electrode through the second via hole.

For example, in some of the embodiments, the thin-film transistor further includes a gate electrode and a source-drain electrode; the source-drain electrode includes a source electrode and a drain electrode; one of the first capacitive electrode and the second capacitive electrode is connected to one of the source electrode and the drain electrode; the other of the first capacitive electrode and the second capacitive electrode is connected to the gate electrode; and the other of the source electrode and the drain electrode is connected to a light emitting element.

At least some of the embodiments of the present disclosure provides a display panel, including the array substrate described above.

At least some of the embodiments of the present disclosure provides a fabrication method of an array substrate, including: providing a base substrate, the base substrate including a first surface; forming a light-shielding portion and a first capacitive electrode on the first surface of the base substrate; forming a thin-film transistor on the light-shielding portion, forming the thin-film transistor including forming an active layer, and forming a second capacitive electrode. The first capacitive electrode and the second capacitive electrode are arranged opposite to each other in a direction perpendicular to the first surface of the base substrate, and at least a portion of an orthogonal projection of the active layer on the first surface of the base substrate is located in an orthogonal projection of the light-shielding portion on the first surface of the base substrate.

For example, in some embodiments, forming the thin film transistor further includes forming a gate electrode and a source-drain electrode.

For example, in some embodiments, the light-shielding portion and the first capacitor electrode are formed by a same patterning process, and the first capacitor electrode is formed of the same conductive material as the light-shielding portion.

For example, in some embodiments, the second capacitor electrode and the active layer are formed by a same patterning process, and the second capacitor electrode is made of a same material as the active layer.

For example, in some embodiments, the second capacitor electrode and the gate electrode are formed by a same patterning process, and the second capacitor electrode is made of a same material as the gate electrode.

For example, in some embodiments, the method further includes forming a third electrode. The source-drain electrode and the third electrode are formed through a same patterning process. The third electrode is made of a same material as the source-drain electrode, and the third electrode is connected to the first capacitor electrode through the first via hole.

For example, in some embodiments, the method further includes: forming a gate line, forming a data line, and forming a power line. The gate line and the data line are intersected to define a pixel region. In a direction perpendicular to the first surface of the base substrate, an orthographic projection of the first capacitive electrode at least partially overlaps with the orthographic projection of at least one of the gate line, the data line, and the power line.

For example, in some embodiments, the method further includes: forming an intermediate dielectric layer covering the active layer, the gate electrode, and the second capacitive electrode; and forming a source-drain electrode via hole in the intermediate dielectric layer. The source-drain electrode are formed on the intermediate dielectric layer, and are connected to the active layer through the source-drain electrode via hole.

For example, in some embodiments, forming the intermediate dielectric layer includes forming the intermediate dielectric layer by using a halftone mask or a gray tone mask, such that the intermediate dielectric layer includes the first dielectric layer sub-portion and the second dielectric layer sub-portion. In a direction perpendicular to the first surface, the first dielectric layer sub-portion is directly above the gate electrode and has a first thickness, the second dielectric layer sub-portion does not overlap the light-shielding portion and has a second thickness, and the first thickness is less than second thickness.

For example, in some embodiments, the method further includes: forming a planarization layer covering the intermediate dielectric layer, the source-drain electrode, and the third electrode; forming a second via hole in the planarization layer; and forming a light-emitting element on the planarization layer. The source-drain electrode includes a source electrode and a drain electrode. The light emitting element is electrically connected to one of the source electrode and the drain electrode through the second via hole.

BRIEF DESCRIPTION OF THE DRAWINGS

In order to clearly illustrate the technical solution of the embodiments of the present disclosure, the drawings to be used in description of the embodiments will be briefly described in the following; it should be understood that, the following drawings only show some embodiments of the present disclosure, and thus should not be regarded as limiting the scope. Base substrated on the drawings, those ordinarily skilled in the art can obtain other related drawings, without any inventive work.

DETAILED DESCRIPTION

A display panel includes an array substrate. The array substrate includes a plurality of display units; and each display unit includes a plurality of pixels. For example, each display unit includes a red pixel, a blue pixel, and a green pixel. An image can be displayed by a combination of light emitted by these pixels. Each pixel can include a pixel circuit and a light emitting element. The pixel circuit can include a storing capacitor and a thin-film transistor.

Figure 1A:
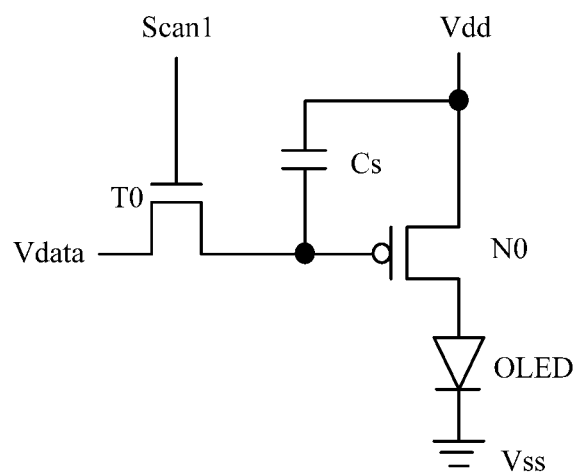
FIG. 1A and FIG. 1B show schematic circuit diagrams of a pixel circuit of an array substrate of an OLED display apparatus.
Figure 1B:
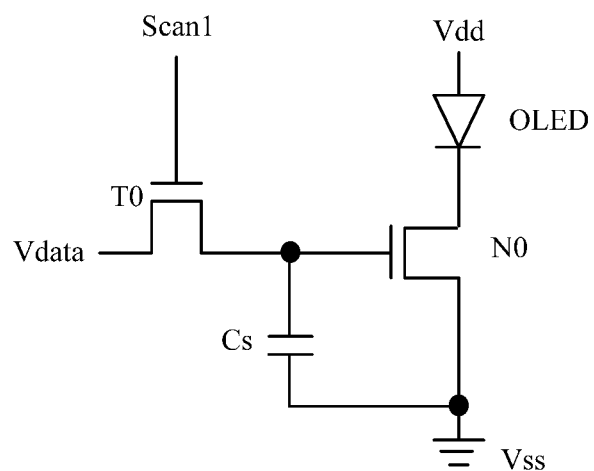

FIG. 1A and FIG. 1B show schematic circuit diagrams of a pixel circuit of an array substrate according to an OLED display panel. A pixel circuit used in an AMOLED display apparatus can be a 2T1C pixel circuit, that is, two Thin-Film Transistors (TFTs) and one storing capacitor Cs are adopted to implement a basic function of driving a light emitting element to emit light. FIG. 1A and FIG. 1B show schematic diagrams of two types of 2T1C pixel circuits respectively.

As shown in FIG. 1A, one type of 2T1C pixel circuit includes a switching transistor T0, a driving transistor N0, and a storing capacitor Cs. For example, a gate electrode of the switching transistor T0 is connected with a scan line to receive a scan signal Scan1, a source electrode, for example, of the switching transistor T0 is connected with a data line to receive a data signal Vdata, and a drain electrode of the switching transistor T0 is connected with a gate electrode of the driving transistor N0; a source electrode of the driving transistor N0 is connected with a first voltage terminal to receive a first voltage Vdd (a high voltage), and a drain electrode of the driving transistor N0 is connected with a positive terminal of an OLED; the storing capacitor Cs has one terminal connected with the drain electrode of the switching transistor T0 and the gate electrode of the driving transistor N0, and the other terminal connected with the source electrode of the driving transistor N0 and the first voltage terminal; and a negative terminal of the OLED is connected with a second voltage terminal to receive a second voltage Vss (a low voltage, for example, a ground voltage). The driving mode of the 2T1C pixel circuit is to control brightness (a grayscale) of the pixel via two TFTs and the storing capacitor Cs. When the scan signal Scan1 is applied through the scan line to turn on the switching transistor T0, the data signal Vdata sent by a data driving circuit through the data line will charge the storing capacitor Cs via the switching transistor T0, thereby storing the data signal Vdata in the storing capacitor Cs, and the stored data signal Vdata controls an ON-degree of the driving transistor N0, thereby controlling a magnitude of a current flowing through the driving transistor to drive the OLED to emit light, that is, the current determines a grayscale of light emission of the pixel. In the 2T1C pixel circuit shown in FIG. 1A, the switching transistor T0 is an N-type transistor and the driving transistor N0 is a P-type transistor.

As shown in FIG. 1B, the other type of 2T1C pixel circuit also includes a switching transistor T0, a driving transistor N0 and a storing capacitor Cs; however, a connection mode thereof is slightly changed, and the driving transistor N0 is an N-type transistor. The pixel circuit of FIG. 1B differs from FIG. 1A in that: the positive terminal of the OLED is connected to a first voltage terminal to receive a first voltage Vdd (a high voltage), and a negative terminal of the OLED is connected with the drain electrode of the driving transistor N0; and a source electrode of the driving transistor N0 is connected to a second voltage terminal to receive a second voltage Vss (a low voltage, for example, a ground voltage). One terminal of the storing capacitor Cs is connected to a drain electrode of the switching transistor T0 and a gate electrode of the driving transistor N0, and the other terminal of the storing capacitor Cs is connected to the source electrode of the driving transistor N0 and the second voltage terminal. The operation mode of the 2T1C pixel circuit is substantially the same as the pixel circuit shown in FIG. 1A, and no details will be repeated here.

In addition, with respect to the pixel circuits shown in FIG. 1A and FIG. 1B, the switching transistor T0 is not limited to an N-type transistor, but can also be a P-type transistor, and thus, it is only necessary to accordingly change polarities of the scan signal Scan1 that controls ON or OFF thereof.

An OLED display apparatus usually includes a plurality of pixel units arranged in an array; and each pixel unit, for example, can include a pixel circuit. In the OLED display apparatus, there can be a difference between threshold voltages of driving transistors in respective pixel circuits due to fabrication process; and a drift phenomenon may occur to the threshold voltage of the driving transistor due to influence of, for example, temperature variation. Therefore, the difference in the threshold voltages of the respective driving transistors may cause poor display (e.g., uneven display), so the threshold voltage needs to be compensated. Meanwhile, in an OFF state, presence of a leakage current may also cause poor display. Therefore, other pixel circuits having a compensating function can also be provided on the basis of the basic pixel circuit of 2T1C; the compensating function can be implemented by voltage compensation, current compensation, or hybrid compensation; and the pixel circuit having a compensating function can be of, for example, a 4T1C type or a 4T2C type, etc., and no details will be repeated here. In addition, inventors finds that, these pixel circuits are expected to provide capacitors with a larger capacitance to improve control performance of the pixel circuits, and meanwhile, the capacitors are expected to occupy less space to facilitate arrangement of other elements in the array substrate.

It should be noted that, the embodiments of the present disclosure are not limited to the above-described configuration of the pixel circuit. The structure of the array substrate according to the embodiments of the present disclosure can be applied to various array substrates including a capacitor and a thin-film transistor.

According to some embodiments of the present disclosure, an array substrate is provided to include: a base substrate, a light-shielding portion, a thin-film transistor, and a capacitor. The base substrate includes a first surface. The light-shielding portion is formed on the first surface of the base substrate. The thin-film transistor is formed on a side of the light-shielding portion that is away from the base substrate, and includes an active layer. The capacitor is formed on the first surface of the base substrate, and includes a first capacitive electrode and a second capacitive electrode. The first capacitive electrode and the second capacitive electrode are at least partially arranged opposite to each other in a direction perpendicular to the first surface of the base substrate. The first capacitive electrode is provided in a same layer as the light-shielding portion. At least a portion of an orthogonal projection of the active layer on the first surface of the base substrate is located in an orthogonal projection of the light-shielding portion on the first surface of the base substrate.

In the above-described embodiment of the present disclosure, because the first capacitive electrode of the capacitor and the light-shielding portion are provided in a same layer, space in the array substrate is effectively utilized. In addition, an area of the first capacitive electrode can be set to be larger than that in a case where it is not provided in a same layer as the light-shielding portion, so as to provide a capacitor having a larger capacitance in the array substrate.

Figure 2:
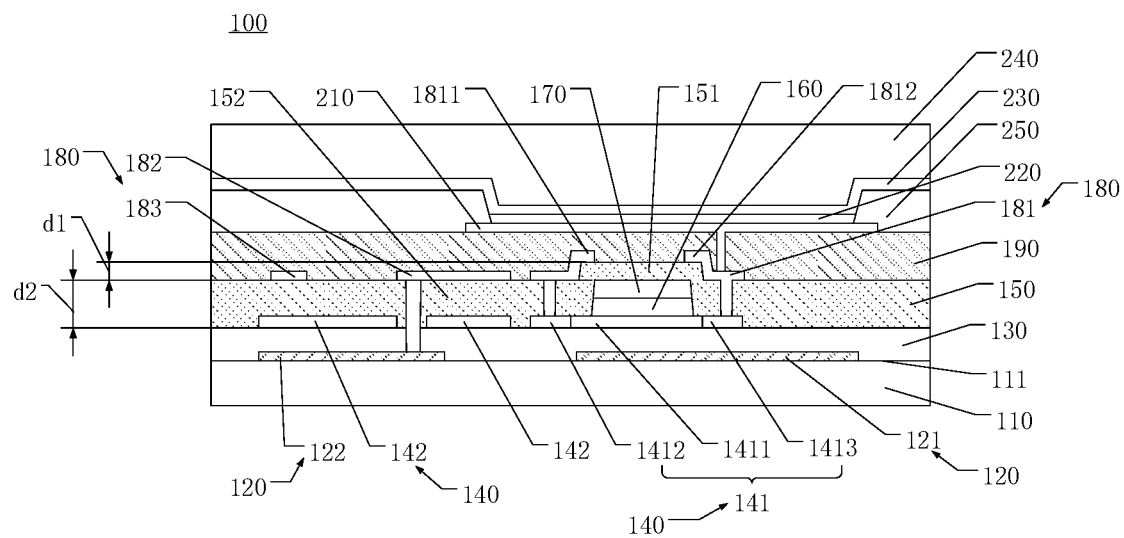
FIG. 2 shows a cross-sectional view of an array substrate according to at least one embodiment of the present disclosure.

FIG. 2 shows a cross-sectional view of an array substrate 100 according to at least one embodiment of the present disclosure. As shown in FIG. 2, the array substrate 100 includes a base substrate 110, a light-shielding portion 121, a thin-film transistor, a capacitor, a light emitting element, a plurality of insulating layers, and a plurality of signal lines.

The thin-film transistor in FIG. 2, for example, corresponds to the thin-film transistor N0 in FIG. 1A and FIG. 1B, which is adopted as a driving transistor. The thin-film transistor can include an active layer 141, a gate electrode 170, and a source-drain electrode 181. The capacitor can include a first capacitive electrode 122, a second capacitive electrode 142, and a third electrode 182.

A plurality of insulating layers, for example, are provided between the respective electrodes (or electrode layers) of the array substrate 100, so that the electrodes are electrically insulated from each other. For example, the plurality of insulating layers can include a buffer layer 130, a gate insulating layer (GI) 160, an Inter-Layer Dielectric (ILD) layer 150, a planarization layer (PLN) 190, a pixel defining layer (PDL) 250, and so on.

The plurality of signal lines can include, for example, a gate line 320, a data line 310 and a power line 183 (respectively adopted to supply a power voltage Vdd or a power voltage Vss), and so on. For example, the gate line and the data line intersect with each other to define a pixel region; a pixel circuit is formed in the pixel region; and the power line 183 supplies a power voltage to the pixel circuit.

The base substrate 110 includes a first surface 111 (i.e., an upper surface in the diagram). The base substrate 110 can be a rigid base substrate or a flexible base substrate. For example, the base substrate 110 can be made of glass, polyimide, polycarbonate, polyethylene, polyacrylate, polyethylene terephthalate, or the like.

The first capacitive electrode 122 of the capacitor and the light-shielding portion 121 are provided in a same layer, and both are provided on the first surface 111 of the base substrate 110. Because the first capacitive electrode 122 and the light-shielding portion 121 are provided in a same layer, space in the array substrate 100 is effectively utilized; in addition, the first capacitive electrode 122 can be set to have a relatively large area in the pixel region, to increase a capacitance of the capacitor, thereby improving control performance of the pixel circuit.

In this embodiment, both the first capacitive electrode 122 and the light-shielding portion 121 are included in a first conductive layer 120 formed on the first surface 111 of the base substrate. The first capacitive electrode 122 is formed of a same conductive material as the light-shielding portion 121. Therefore, the first capacitive electrode 122 and the light-shielding portion 121 can be formed by a same patterning process, which is favorable for simplifying a fabrication process and reducing fabrication costs. The first conductive layer 120 can include one or more of Au, Ag, Cu, Ni, Pt, Pd, Al, Mo, and so on. The first conductive layer 120 can be a single metal layer or a metal multi layer (metal layer stack).

In this embodiment, the first conductive layer 120 is formed of Mo. In addition, the first conductive layer 120 can be formed by dry etching to reduce a slope angle, which, thus, can prevent metal wire from climbing on the one hand, and can prevent slopes of respective inorganic layers from being too steep at a junction with an edge of other metal layer on the other hand.

For example, the first capacitive electrode 122 and the light-shielding portion 121 can be independent of and insulated from each other, or can be electrically connected with each other, for example, integrally formed.

The buffer layer 130 covers the first surface 111 and the first conductive layer 120 of the base substrate 110, that is, covers the first surface 111, the light-shielding portion 121, and the first capacitive electrode 122 of the base substrate 110, to prevent impurity ions in the base substrate 110 from adversely affecting circuit elements that will be formed on the buffer layer 130 later.

In this embodiment, the second capacitive electrode 142 and the active layer 141 are provided in a same layer, and are both formed on the buffer layer 130.

In a direction perpendicular to the first surface 111 of the base substrate 110, a portion of an orthogonal projection of the active layer 141 (e.g., a portion including a channel region 1411) is located in an orthogonal projection of the light-shielding portion 121. In other words, the portion of the orthogonal projection of the active layer 141 (e.g., the portion including the channel region 1411) on the first surface 111 of the base substrate 110 is located in the orthogonal projection of the light-shielding portion 121 on the first surface 111 of the base substrate 110. The light-shielding portion 121 is adopted to block light from being incident onto the active layer 141 from the outside, so as to avoid performance degradation of the thin-film transistor due to the active layer 141 thereof being exposed to light. In other examples, in the direction perpendicular to the first surface 111 of the base substrate 110, the whole orthogonal projection of the active layer 141 is located in the orthogonal projection of the light-shielding portion 121.

The active layer 141 can include polysilicon (e.g., low-temperature polysilicon or high-temperature polysilicon) or an oxide semiconductor. For example, the active layer 141 includes the channel region 1411 not doped (n-doped or p-doped) with impurities, as well as a source region 1413 and a drain region 1412 located on opposite sides of the channel region 1411 and doped with impurities. For example, the second capacitive electrode 142 can be doped with impurities, and thus has better conductivity as compared with a case where it is undoped.

In the direction perpendicular to the first surface 111 of the base substrate 110, the first capacitive electrode 122 and the second capacitive electrode 142 are at least partially arranged opposite to each other; and a buffer layer 130 is provided therebetween. Therefore, the first capacitive electrode 122 and the second capacitive electrode 142 can form a first capacitor, in which the buffer layer 130 serves as a dielectric material between the first capacitive electrode 122 and the second capacitive electrode 142.

For example, the second capacitive electrode 142 can be formed from a same material as the active layer 141. That is, both the second capacitive electrode 142 and the active layer 141 are included in a semiconductor layer 140 formed on the buffer layer 130. Therefore, the second capacitive electrode 142 and the active layer 141 can be formed by a same patterning process, which is favorable for simplifying a fabrication process and reducing fabrication costs.

It should be noted that, the second capacitive electrode 142 is not limited to be provided in a same layer as the active layer 141, as long as the first capacitive electrode 122 and the second capacitive electrode 142 are at least partially arranged opposite to each other, and an insulating layer is provided therebetween to form the first capacitor. In other embodiments, the second capacitive electrode 142 can also be provided in a same layer as the gate electrode 170, and be formed from a same material by a same patterning process as the gate electrode 170, or, the second capacitive electrode 142 can also be provided in a same layer as the source-drain electrode 181, and be formed from a same material by a same patterning process as the source-drain electrode 181.

Returning to FIG. 2, the gate insulating layer 160 is formed on the active layer 141; and the gate electrode 170 is formed on the gate insulating layer 160. For example, the gate electrode 170 overlaps with the channel region 1411 of the active layer 141. The gate insulating layer 160 can be formed as a single layer of silicon nitride (SiNx) or silicon oxide (SiO$_2$) or a stacked layer of silicon nitride (SiNx) and silicon oxide (SiO$_2$). As shown in the figure, the gate insulating layer 160 and the gate electrode 170 are formed into a same pattern, and thus have a same cross-sectional profile; for example, the gate insulating layer 160 and the gate electrode 170 are formed by a same patterning process.

The inter-layer dielectric layer 150 covers the gate electrode 170, the active layer 141 and the second capacitive electrode 142, and functions to protect the gate electrode 170, the active layer 141 and the second capacitive electrode 142; for another example, in some embodiments as described below, the inter-layer dielectric layer 150 can also partially play a role in planarization. The inter-layer dielectric layer 150 can be formed from an inorganic insulating material or an organic insulating material.

The source-drain electrode 181 and the third electrode 182 are formed on the inter-layer dielectric layer 150. The third electrode 182 is provided in a same layer as the source-drain electrode 181, and is formed from a same material as the source-drain electrode 181. That is, both the third electrode 182 and the source-drain electrode 181 are included in a second conductive layer 180 formed on the inter-layer dielectric layer 150. Therefore, the third electrode 182 and the source-drain electrode 181 can be formed by a same patterning process, which is favorable for simplifying a fabrication process and reducing fabrication costs. The second conductive layer 180 can include one or more of Au, Ag, Cu, Ni, Pt, Pd, Al, Mo, and so on. The second conductive layer 180 can be a single metal layer or a metal multi-layer.

The source-drain electrode 181 can include a first source-drain electrode 1811 and a second source-drain electrode 1812; for example, in this embodiment, the first source-drain electrode 1811 and the second source-drain electrode 1812 are a drain electrode and a source electrode respectively. Or, in other embodiments, the first source-drain electrode 1811 and the second source-drain electrode 1812 can also be a source electrode and a drain electrode respectively. The first source-drain electrode 1811 and the second source-drain electrode 1812 can be electrically connected with a drain region 1412 and a source region 1413 of the active layer 141 respectively through source-drain electrode via holes formed in the inter-layer dielectric layer 150.

In this embodiment, the third electrode 182 and the first capacitive electrode 122 are electrically connected with each other through a first via hole running through the inter-layer dielectric layer 150 and the buffer layer 130.

In other embodiments, the gate insulating layer 160 can not be formed into a same pattern as the gate electrode 170, for example, it can cover the entire semiconductor layer 140, and have via holes formed therein, which allow the first source-drain electrode 1811 and the second source-drain electrode 1812 to be electrically connected with the drain region 1412 and the source region 1413 of the active layer 141, and allow the third electrode 182 to be electrically connected with the first capacitive electrode 122.

The first capacitive electrode 122 can be connected to a signal line, for example, the power line 183, through the third electrode 182. In the illustrated embodiment, the power line 183 is also formed in the second conductive layer 180. Therefore, the third electrode 182, the source-drain electrode 181 and the power line 183 are arranged in a same layer. In addition, the third electrode 182, the source-drain electrode 181 and the power line 183 can be formed from a same material. Therefore, the third electrode 182, the source-drain electrode 181 and the power line 183 can be formed by a same patterning process, thereby simplifying a fabrication process and reducing fabrication costs. In addition, the third electrode 182 can be electrically connected with the power line 183 to control a voltage of the third electrode 182; for example, the third electrode 182 can be integrally formed with the power line 183.

In this embodiment, the third electrode 182 itself can also be adopted as a portion of the capacitor to increase a capacitance. The third electrode 182 is at least partially opposite to the second capacitive electrode 142 in the direction perpendicular to the first surface 111 of the base substrate 110. Therefore, while the first capacitive electrode 122 and a portion of the second capacitive electrode 142 form the first capacitor, the third electrode 182 and another portion of the second capacitive electrode 142 form a second capacitor. Because the third electrode 182 is electrically connected with the first capacitive electrode 122, the first capacitor and the second capacitor are provided in parallel, and the two capacitors together form a capacitor having a larger capacitance.

Therefore, the first capacitive electrode 122 provided in a same layer as the light-shielding portion 121 and the portion of the second capacitive electrode 142 expand an area of a pair of electrode plates of the second capacitor, thereby increasing a capacitance of the second capacitor; for example, the magnitude of the capacitance increased is substantially equal to the magnitude of the capacitance of the first capacitor. Similarly, the third electrode 182 and the other portion of the second capacitive electrode 142 expand an area of the pair of electrode plates of the first capacitor, thereby increasing the capacitance of the first capacitor; for example, the magnitude of the capacitance increased is substantially equal to the magnitude of the capacitance of the second capacitor.

Because the capacitors having a larger capacitance are formed by electrodes provided in different layers, the space of the array substrate 100 is effectively utilized.

In other embodiments, the third electrode 182 may not included in the array substrate 100; and the first capacitive electrode 122 can be directly connected to the signal line or other conductor portions. In other embodiments, the third electrode 182 may not form the second capacitor with the second capacitive electrode 142, for example, the capacitor is formed only by the first capacitive electrode 122 and the second capacitive electrode 142.

In addition, the array substrate 100 can include a plurality of signal lines. The first capacitive electrode 122 and the second capacitive electrode 142 can respectively extend to overlap at least one of the plurality of signal lines in the direction perpendicular to the first surface 111 of the base substrate 110. The plurality of signal lines are, for example, the data line 310, the gate line 320 and the power line 183, so that space in the pixel region can be further utilized to increase the capacitance.

Figure 3:
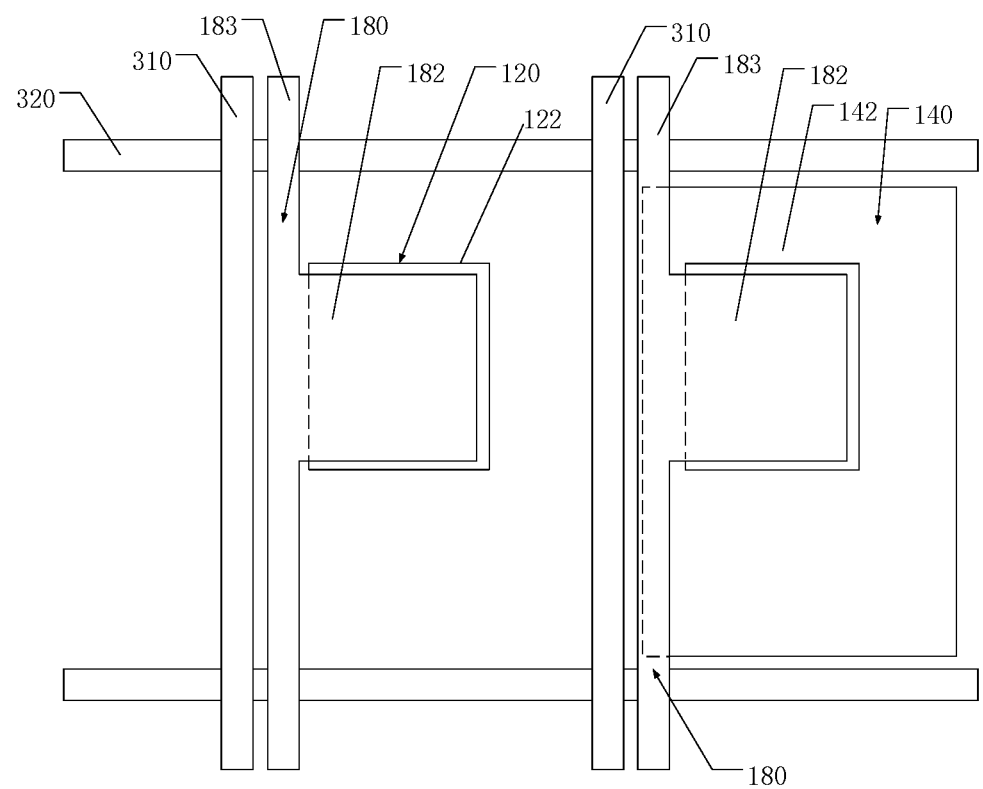
FIG. 3 shows a schematic top view of an array substrate according to at least one embodiment of the present disclosure.

FIG. 3 shows a schematic top view of an array substrate 100 according to at least one embodiment of the present disclosure. As shown in FIG. 3, the array substrate 100 includes a signal line; the signal line includes a data line 310, a gate line 320, and a power line 183 (for clarity, only one data line 310, one gate line 320 and one power line 183 are shown in FIG. 3, but the embodiment of the present disclosure is not limited thereto). For example, the gate line 320 and the data line 310 intersect with each other to define a pixel region. The first conductive layer 120 and the second conductive layer 180 are shown in a pixel region on the left side in FIG. 3, the semiconductor layer 140 and the second conductive layer 180 are shown in a pixel region on the right side in FIG. 3; and other structures are omitted.

As shown in FIG. 2 and FIG. 3, the first capacitive electrode 122 and the second capacitive electrode 142 can respectively extend below the power line 183. That is, orthogonal projections of the first capacitive electrode 122 and the second capacitive electrode 142 at least partially overlap with an orthogonal projection of the power line 183. For example, as shown in FIG. 2, the power line 183 is formed on the inter-layer dielectric layer 150 and is included in the second conductive layer 180, which, thus, further increases the area of the pair of electrode plates of the first capacitor formed by the first capacitive electrode 122 and the second capacitive electrode 142, thereby increasing a capacitance of the capacitor in the array substrate 100. For example, the power line 183 can be electrically connected to the third electrode 182, as described above. In other embodiments, for example, the power line 183 can be electrically connected to the second capacitive electrode 142 or the first capacitive electrode 122 to control a voltage of the second capacitive electrode 142 or the first capacitive electrode 122, but the embodiments of the present disclosure are not limited thereto. For example, the power line 183 can be connected to a source power voltage Vss, but the embodiments of the present disclosure are not limited thereto.

In addition, in some embodiments, the first capacitive electrode 122 has a first complementary portion; the second capacitive electrode 142 has a second complementary portion; and a shape of a projection of the first complementary portion on the first surface 111 of the base substrate 110 is complementary to a shape of a projection of the second complementary portion on the first surface 111 of the base substrate 110. For example, in one example, as shown in FIG. 3, the first complementary portion of the first capacitive electrode 122 is rectangular; the second complementary portion of the second capacitive electrode 142 is rectangular; and the rectangular first complementary portion and the rectangular second complementary portion are mutually complementary. Therefore, a maximum thickness difference (a step difference) that the upper surface of the array substrate 100 has before forming the planarization layer 190 (which will be described later) can be reduced. The first complementary portion and the second complementary portion are not limited to have shapes of rectangles, and can also have other shapes, for example, triangles or other irregular shapes.

Figure 4:
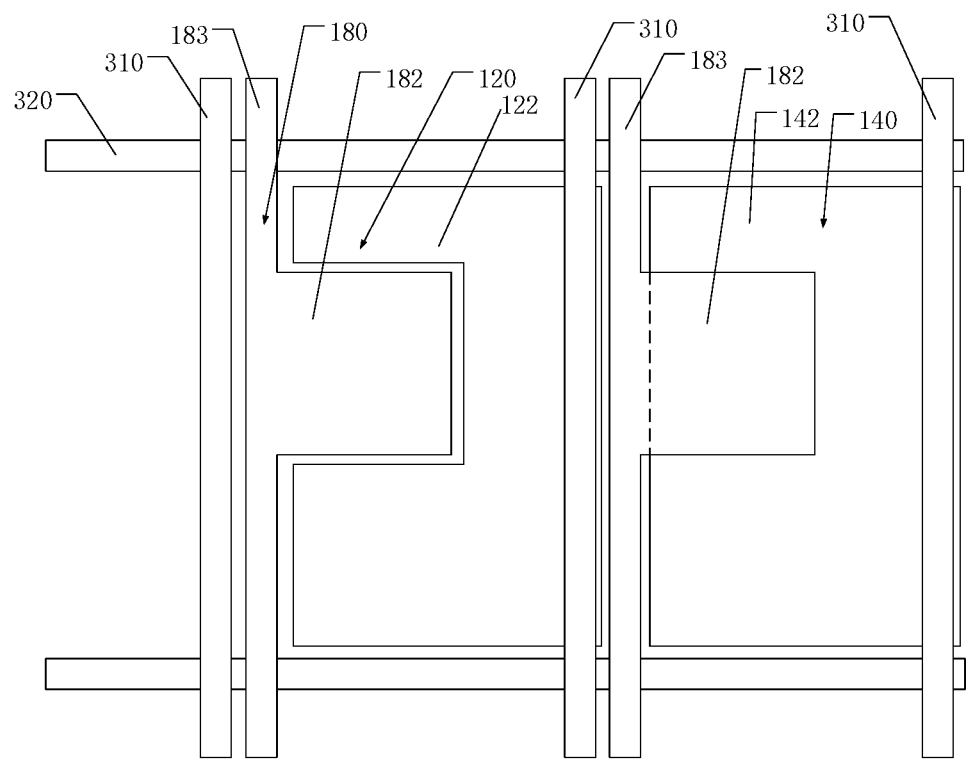
FIG. 4 shows a schematic top view of an array substrate according to another embodiment of the present disclosure.

FIG. 4 shows a schematic top view of an array substrate 100 according to another embodiment of the present disclosure. As shown in FIG. 4, the array substrate 100 includes a signal line; the signal line includes a data line 310, a gate line 320, and a power line 183 (for clarity, only one data line 310, one gate line 320 and one power line 183 are shown in FIG. 4, but the embodiment of the present disclosure is not limited thereto). For example, the gate line 320 and the data line 310 intersect with each other to define a pixel region. The first conductive layer 120 and the second conductive layer 180 are shown in a pixel region on the left side in FIG. 4; the semiconductor layer 140 and the second conductive layer 180 are shown in a pixel region on the right side in FIG. 4; and other structures are omitted.

As shown in FIG. 4, the first capacitive electrode 122 and the second capacitive electrode 142 can respectively extend below the data line 310. That is, orthogonal projections of the first capacitive electrode 122 and the second capacitive electrode 142 at least partially overlap with an orthogonal projection of the data line 310, which, thus, further increases the area of the pair of electrode plates of the first capacitor formed by the first capacitive electrode 122 and the second capacitive electrode 142, thereby increasing a capacitance of the capacitor in the array substrate 100.

Returning to FIG. 2, the planarization layer 190 covers the third electrode 182, the source-drain electrode 181, and the inter-layer dielectric layer 150. The planarization layer 190 is adopted to form a flat surface, to form a light emitting element on the flat surface. The light emitting element is formed on the flat surface of the planarization layer 190 (i.e., the upper surface in FIG. 2), and thus can have relatively uniform characteristics.

In this embodiment, the light emitting element is an Organic Light-Emitting Diode (OLED). In addition, the light emitting element can also be a Quantum Dot Light-Emitting Diode (QLED), or the like, and the embodiment of the present disclosure is not limited thereto. For example, in other embodiments, the array substrate can be an array substrate used in a liquid crystal display apparatus or an electronic paper display apparatus, and in this case, it is not necessary to form a light emitting element on the planarization layer of the array substrate; for example, in a case of a liquid crystal display apparatus, the planarization layer of the array substrate is formed thereon with a pixel electrode for controlling deflection of a liquid crystal material, and can be further formed with a common electrode in a layer the same as or different from the pixel electrode; in a case of an electronic paper display apparatus, the planarization layer of the array substrate is formed thereon with a pixel electrode and an electronic ink layer, and the pixel electrode is adopted to apply a voltage for driving charged microparticles in the electronic ink to move for a display operation.

Taking an organic light-emitting diode as an example, the organic light-emitting diode includes a first driving electrode 210, a second driving electrode 230, and a light-emitting layer 220 between the first driving electrode 210 and the second driving electrode 230. The first driving electrode 210 is formed on the flat surface of the planarization layer 190; the light-emitting layer 220 is formed on the first driving electrode 210; and the second driving electrode 230 is formed on the light-emitting layer 220.

In addition, the array substrate 100 further includes a pixel defining layer 250 having an opening to define a light-emitting region; and the light-emitting layer 220 is formed in the opening. For example, the second driving electrode 230 can be a common electrode, which can be provided on the whole or a portion of a display region, and cover a plurality of pixels, that is, be shared by the plurality of pixels. When an appropriate voltage is applied between the first driving electrode 210 and the second driving electrode 230, one of the first driving electrode 210 and the second driving electrode 230 injects holes into the light-emitting layer 220, and the other injects electrons into the light-emitting layer 220. The electrons and the holes recombine with each other in the light-emitting layer 220 to generate excitons, causing light emission by energy generated as the excitons fall from an excited state back to a ground state.

For example, in the illustrated embodiment, the organic light-emitting diode can have a top emission structure, but can also have a bottom emission structure or a double-sided emission structure according to needs, and the embodiment of the present disclosure is not limited thereto.

An encapsulation layer (or a package layer) 240 covers the second driving electrode 230. The encapsulation layer 240 can seal the organic light-emitting diode, thereby reducing or avoiding degradation of the organic light-emitting diode caused by moisture and/or oxygen included in the environment. For example, the encapsulation layer 240 can include a structure in which an inorganic layer and an organic layer are stacked.

The light-emitting layer 220 as described above can be formed by evaporation or printing. As compared with a light-emitting layer 220 formed by evaporation, a light-emitting layer 220 formed by printing has higher color directivity, which improves organic light-emitting diode display in terms of color. The first driving electrode 210 shown in FIG. 2 has a flat surface. However, if the surface onto which the light-emitting layer 220 is printed has a concave-convex structure, a thickness of the light-emitting layer 220 will be uneven; further, unevenness of the thickness of the light-emitting layer 220 will cause uneven light emission between different pixels, shorten service life, and so on. Therefore, by improving flatness of the surface onto which the light-emitting layer 220 is printed, a display effect of the display apparatus adopting the array substrate can be improved accordingly.

As shown in FIG. 2, the array substrate 100 has a layer stack formed by the light-shielding portion 121, the active layer 141, the gate insulating layer 160, the gate electrode 170, the inter-layer dielectric layer 150, the source-drain electrode layer 181 and the planarization layer 190. The light emitting element is formed on the layer stack. However, because structures such as the active layer 141, the gate insulating layer 160, the gate electrode 170, and the source-drain electrode layer 181 have specific patterns, a height of the layer stack is increased in the portion region where the corresponding structures exist, as compared with the portion region where the corresponding structures do not exist, so that the stack has an uneven surface. For example, in the portion region where the gate electrode 170 is located in the layer stack, superposition of the active layer 141, the gate insulating layer 160 and the gate electrode 170 in the direction perpendicular to the first surface 111 of the base substrate 110 makes the portion region particularly have an increased height, which causes unevenness of the layer stack.

As described above, the planarization layer 190 covers the third electrode 182, the source-drain electrode 181 and the inter-layer dielectric layer 150; and the planarization layer 190 is adopted to form a flat surface (e.g., the upper surface of the planarization layer in FIG. 2), so that the light emitting element is formed on the flat surface.

However, if a surface height difference of the layer stack before forming the planarization layer 190 is particularly large, it is not favorable for the planarization layer 190 to form a flat surface, which can result in that a flat surface may not be formed, or a thicker planarization layer 190 is needed to be formed (causing a thicker array substrate 100 to be formed).

Therefore, in order to reduce the surface height difference of the layer stack before forming the planarization layer 190, on the one hand, surface height differences caused by the active layer 141, the gate insulating layer 160, the gate electrode 170, and the source-drain electrode layer 181, etc. can be reduced; on the other hand, the inter-layer dielectric layer 150, etc. can compensate for these surface height differences.

For example, in this embodiment, a coverage area of the light-shielding portion 121 (or say, the first conductive layer 120) is expanded by providing the first capacitive electrode 122, thereby reducing thickness unevenness caused by the partially provided light-shielding portion 121. In addition, in other embodiments, in addition to the first capacitive electrode 122 or instead of the first capacitive electrode 122, the coverage area of the light-shielding portion 121 can be further expanded to other portion region that does not overlap with the gate electrode 170 in the direction perpendicular to the first surface 111 of the base substrate 110, or to other portion region that does not overlap with other signal line (e.g., gate line, data line, and power line), thereby reducing thickness unevenness caused by the partially provided light-shielding portion 121.

For example, in this embodiment, a coverage area of the active layer 141 (or say, the semiconductor layer 140) is expanded by providing the second capacitive electrode 142, thereby reducing thickness unevenness caused by the partially provided active layer 141. In addition, in other embodiments, in addition to the second capacitive electrode 142 or instead of the second capacitive electrode 142, the coverage area of the active layer 141 can be further expanded to other portion of region that does not overlap with the gate electrode 170, or to other portion of region that does not overlap with other signal line (e.g., gate line, data line, and power line), thereby reducing thickness unevenness caused by the partially provided light-shielding portion 121.

In addition, for example, in this embodiment, in order to reduce thickness unevenness due to the structures such as the gate electrode 170, the inter-layer dielectric layer 150 is configured to have a first dielectric layer sub-portion 151 and a second dielectric layer sub-portion 152. An orthogonal projection of the gate electrode 170 on the first surface 111 of the base substrate 110 is within an orthogonal projection of the first dielectric layer sub-portion 151 on the first surface 111 of the base substrate 110. An orthogonal projection of the second dielectric layer sub-portion 152 on the first surface 111 of the base substrate 110 does not overlap with the orthogonal projection of the gate electrode 170 on the first surface 111 of the base substrate 110. In addition, the first dielectric layer sub-portion 151 has a first thickness d1; the second dielectric layer sub-portion 152 has a second thickness d2; and the first thickness d1 is smaller than the second thickness d2. In particular, in the direction perpendicular to the first surface 111 of the base substrate 110, the first dielectric layer sub-portion 151 is directly above the gate electrode 170 and has the first thickness d1, and the second dielectric layer sub-portion 152 does not overlap with the gate electrode 170, and has the second thickness d2 greater than the first thickness d1. Therefore, the inter-layer dielectric layer 150 having different thicknesses in different positions will compensate for thickness unevenness caused by the gate electrode 170.

For example, in a case where the inter-layer dielectric layer 150 has a substantially uniform thickness, before forming the planarization layer 190, the upper surface of the array substrate 100 has a maximum thickness difference (a step difference) of about 1 μm, so that the planarization layer may not completely planarize the thickness difference. In a case where the inter-layer dielectric layer 150 is formed to have the first dielectric layer sub-portion 151 and the second dielectric layer sub-portion 152 to compensate for the unevenness caused by the gate electrode 170, before forming the planarization layer 190, the upper surface of the array substrate 100 has a maximum thickness difference of about 0.4 μm to 0.6 μm. Therefore, the inter-layer dielectric layer 150 compensates for thickness unevenness caused by the gate electrode 170. Moreover, because the inter-layer dielectric layer 150 reduces a planarization difficulty for the planarization layer 190, more possibilities for material selection are provided for the planarization layer 190.

In the above-described embodiment, by the ways such as expanding the region where the first capacitive electrode 122 or the light-shielding portion 121 is located, expanding the region where the second capacitive electrode 142 is located, and adjusting the thickness (or the thickness difference) of the inter-layer dielectric layer 150 in different regions, the surface of the inter-layer dielectric layer 150 that is away from the base substrate 110 has smaller undulation, so that the surface of the planarization layer 190 formed on the inter-layer dielectric layer 150 can have a better degree of planarization; and these modes can be used independently, or can also be used in arbitrary combination, which will not be limited in the embodiment of the present disclosure.

The inter-layer dielectric layer 150, for example, can be formed with a half tone mask or a gray tone mask, so that it has the first dielectric layer sub-portion 151 and the second dielectric layer sub-portion 152.

Figure 5:
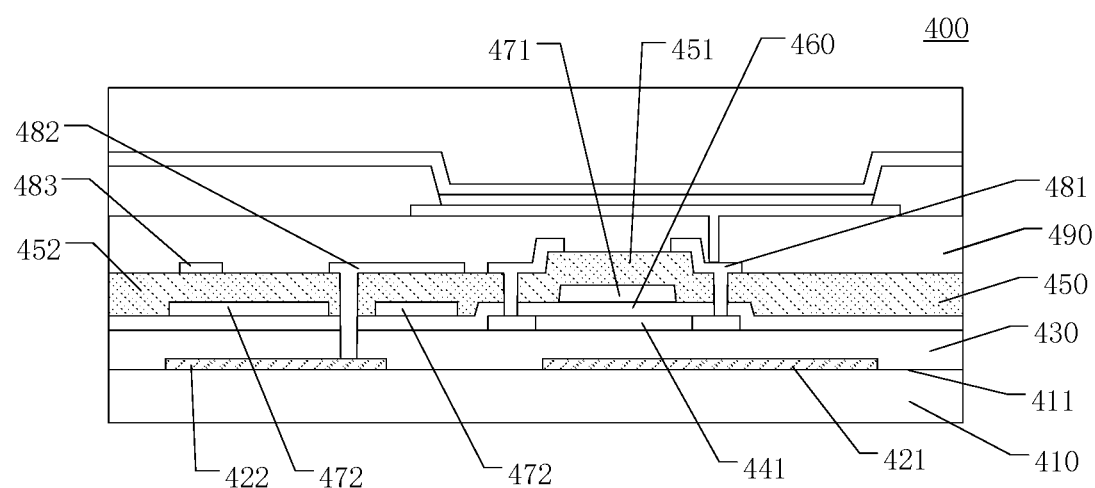
FIG. 5 shows a cross-sectional view of an array substrate according to another embodiment of the present disclosure.

FIG. 5 shows a cross-sectional view of an array substrate 400 according to another embodiment of the present disclosure.

Similar to the array substrate 100 shown in FIG. 2, as shown in FIG. 5, the array substrate 400 according to this embodiment includes a base substrate 410, a light-shielding portion 421, a thin-film transistor, a capacitor, a light emitting element, a plurality of insulating layers, and a plurality of signal lines.

The thin-film transistor can include an active layer 441, a gate electrode 471, and a source-drain electrode 481. The capacitor can include a first capacitive electrode 422, a second capacitive electrode 472, and a third electrode 482.

For example, the plurality of insulating layers includes a buffer layer 430, a gate insulating layer 460, an inter-layer dielectric layer 450, a planarization layer 490, a pixel defining layer, and so on.

The plurality of signal lines can includes, for example, gate lines, data lines, and power lines 483 (Vdd, Vss, or Vdd, etc.), and so on.

The base substrate 410 includes a first surface 411. The first capacitive electrode 422 of the capacitor and the light-shielding portion 421 are provided in a same layer, and both are provided on the first surface 411 of the base substrate 410. The first capacitive electrode 422 is formed of a same conductive material as the light-shielding portion 421.

The buffer layer 430 covers the first surface 411 of the base substrate 410, the light-shielding portion 421, and the first capacitive electrode 422.

The active layer 441 is formed on the buffer layer 430. At least a portion of an orthogonal projection of the active layer 441 is located in an orthogonal projection of the light-shielding portion 421. The gate insulating layer 460 covers the active layer 441.

The embodiment shown in FIG. 5 differs from the embodiment shown in FIG. 2 in that, the second capacitive electrode 472 and the gate electrode 471 are provided in a same layer. For example, both the second capacitive electrode 472 and the gate electrode 471 are formed on the gate insulating layer 460. In addition, the second capacitive electrode 472 is formed of a same material as the gate electrode 471. The first capacitive electrode 422 and the second capacitive electrode 472 are at least partially arranged opposite to each other, and the buffer layer 430 and the gate insulating layer 460 are provided therebetween as a dielectric material, to form a first capacitor.

The inter-layer dielectric layer 450 covers the second capacitive electrode 472, the gate electrode 471 and the gate insulating layer 460.

Similar to the embodiment shown in FIG. 2, in the embodiment shown in FIG. 5, the source-drain electrode 481 and the third electrode 482 are formed on the inter-layer dielectric layer 450. The third electrode 482 is provided in a same layer as the source-drain electrode 481, and is formed from a same material as the source-drain electrode 481. The third electrode 482 and the first capacitive electrode 422 are electrically connected with each other through a first via hole running through the inter-layer dielectric layer 450, the gate insulating layer 460, and the buffer layer 430.

The third electrode 482 is at least partially opposite to the second capacitive electrode 472 in a direction perpendicular to the first surface 411 of the base substrate 410. Therefore, while the first capacitive electrode 422 and a portion of the second capacitive electrode 442 form the first capacitor, the third electrode 482 and another portion of the second capacitive electrode 442 form a second capacitor. Because the third electrode 482 is electrically connected with the first capacitive electrode 422, the first capacitor and the second capacitor are arranged in parallel, and the two capacitors together form a capacitor having a larger capacitance.

In addition, the first capacitive electrode 422 and the second capacitive electrode 472 can respectively extend to overlap with at least one of the plurality of signal lines, such as the power line 483, in the direction perpendicular to the first surface 411 of the base substrate 410.

The planarization layer 490 covers the third electrode 482, the source-drain electrode 481 and the inter-layer dielectric layer 450; and the light emitting element is formed on the planarization layer 490.

At least one embodiment of the present disclosure further provides a display apparatus, including, for example, any one of the array substrates 100, 400 according to the embodiments as described above.

At least one embodiment of the present disclosure further provides a display apparatus. The display apparatus, for example, can be implemented as: a liquid crystal panel, an electronic paper panel, an Organic Light-Emitting Diode (OLED) panel, a mobile phone, a tablet personal computer, a television, a monitor, a laptop, a digital photo frame, a navigator, and any other product or component having a display function.

Figure 6:
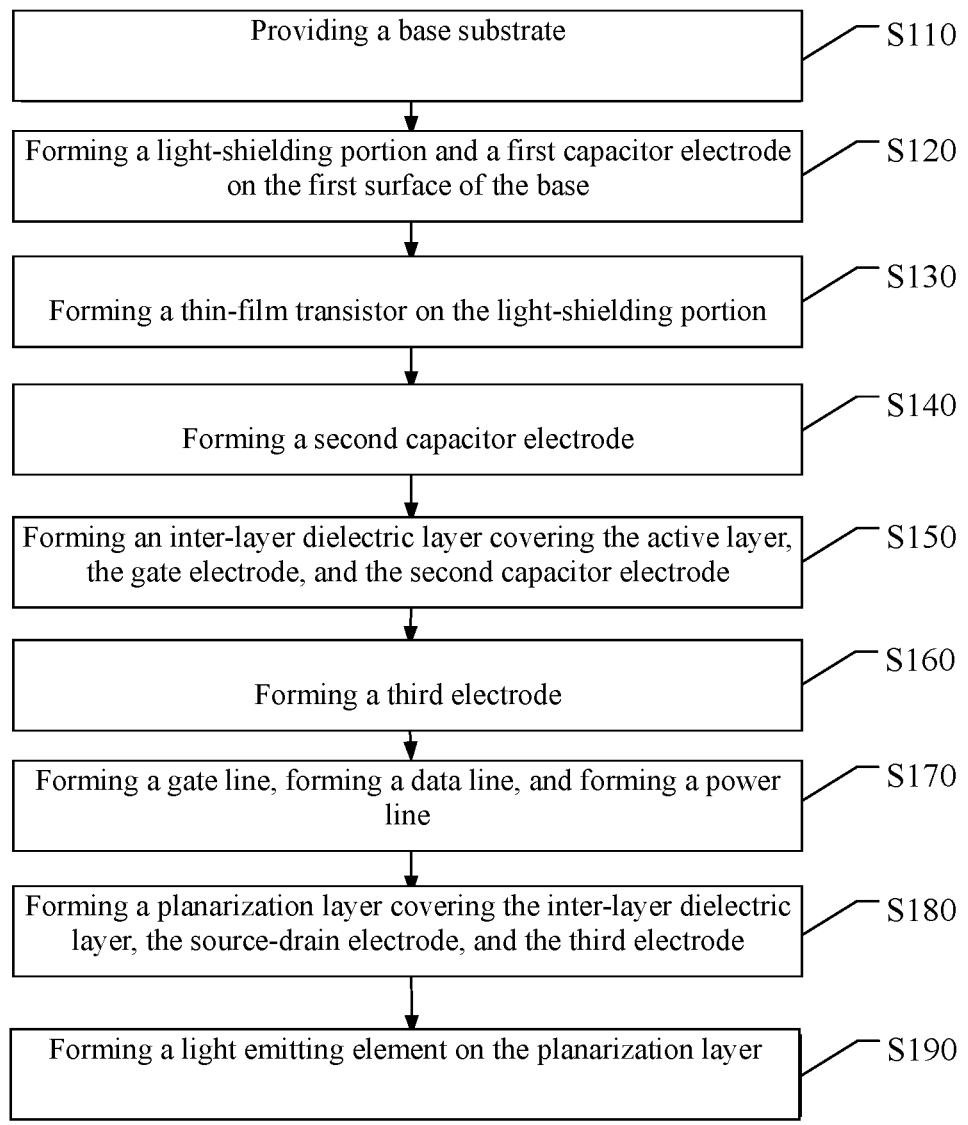
FIG. 6 shows a flow chart of a fabrication method of an array substrate according to at least one embodiment of the present disclosure.

FIG. 6 shows a flow chart of a fabrication method of an array substrate according to at least one embodiment of the present disclosure. The fabrication method can be used for fabricating any one of the array substrates 100, 400 according to the embodiments as described above.

Hereinafter, the fabrication method of the array substrate according to the embodiment of the present disclosure will be described by taking the array substrate 100 as an example, but the embodiment of the present disclosure is not limited to specific examples described.

As shown in FIG. 2 and FIG. 6, the fabrication method of the array substrate 100 includes steps of:

S110: providing a base substrate 110, the base substrate 110 including a first surface 111;

S120: forming a light-shielding portion 121 and a first capacitive electrode 122 on the first surface 111 of the base substrate 110;

S130: on the light-shielding portion 121, forming a thin-film transistor including forming an active layer 141, forming a gate electrode 170, and forming a source-drain electrode 181;

S140: forming a second capacitive electrode 142.

The first capacitive electrode 122 and the second capacitive electrode 142 thus formed are arranged opposite to each other in a direction perpendicular to the first surface 111 of the base substrate 110. In the direction perpendicular to the base substrate 110, at least a portion of an orthogonal projection of the active layer 141 is located in an orthogonal projection of the light-shielding portion 121.

For example, with respect to step S120, the light-shielding portion 121 and the first capacitive electrode 122 can be formed by a same patterning process, and the first capacitive electrode 122 is formed of a same conductive material as the light-shielding portion 121, which, thus, can simplify fabrication steps and reduce fabrication costs.

For example, with respect to step S130 and step S140, the second capacitive electrode 142 and the active layer 141 can be formed by a same patterning process, and the second capacitive electrode 142 is formed from a same material as the active layer 141, which, thus, can simplify fabrication steps and reduce fabrication costs.

In other embodiments, as shown in FIG. 5, with respect to step S130 and step S140, the second capacitive electrode 142 and the gate electrode 170 can be formed by a same patterning process, and the second capacitive electrode 142 is formed from a same material as the gate electrode 170.

In other embodiments, with respect to step S130 and step S140, the second capacitive electrode 142 and the source-drain electrode 181 can be formed by a same patterning process, and the second capacitive electrode 142 is formed from a same material as the source-drain electrode 181.

In addition, for example, as shown in FIG. 6, the method can further include steps of sequentially forming respective layer structures on the base substrate.

S150: forming an inter-layer dielectric layer 150 covering the active layer 141, the gate electrode 170, and the second capacitive electrode 142;

S160: forming a third electrode 182;

S170: forming a gate line 320, forming a data line 310, and forming a power line 183; and S180: forming a planarization layer 190 covering the inter-layer dielectric layer 150, the source-drain electrode 181, and the third electrode 182;

S190: forming a light emitting element on the planarization layer 190.

In step S170, for example, the gate line 320 and the data line 310 intersect with each other to define a pixel region. In the direction perpendicular to the first surface 111 of the base substrate 110, orthogonal projections of the first capacitive electrode 122 and the second capacitive electrode 142 at least partially overlap with an orthogonal projection of at least one of the gate line 320, the data line 310 (as shown in FIG. 4), and the power line 183 (as shown in FIG. 3).

After step S150, a source-drain electrode via hole can be formed in the inter-layer dielectric layer 150. For example, the source-drain electrode 181 is formed on the inter-layer dielectric layer 150, and is electrically connected with the active layer 141 through the source-drain electrode via hole in the inter-layer dielectric layer 150. In addition, with respect to step S160 and step S130, the source-drain electrode 181 and the third electrode 182 can be formed on the inter-layer dielectric layer 150 by a same patterning process; and the third electrode 182 is formed from a same material as the source-drain electrode 181. The third electrode 182 is connected to the first capacitive electrode 122 through a first via hole.

After step S180, a second via hole can be formed in the planarization layer 190. The light emitting element is electrically connected with the source-drain electrode 181 through the second via hole.

Referring to FIG. 2, in step S190, forming the light emitting element includes forming a first driving electrode 210 and a pixel defining layer 190 on the planarization layer 190; and the pixel defining layer 190 includes an opening that defines a light-emitting region. In addition, in step S190, forming the light emitting element further includes forming a light-emitting layer 220 in the opening of the pixel defining layer 190 and on the first driving electrode 210; and forming a second driving electrode 230 on the light-emitting layer 220 and the pixel defining layer 190. For example, the second driving electrode 230 can be a common electrode. For example, the first driving electrode 210 of the light emitting element is connected to a second source-drain electrode 1812 in the source-drain electrode 181 through the second via hole in the planarization layer 190. For example, the second source-drain electrode 1812 is connected to a source region 1413 in the active layer 141 through the source-drain electrode via hole.

For example, as described above, flatness of a surface to which the light-emitting layer 220 is printed needs to be improved.

In addition, as described above, in order to reduce thickness unevenness caused by the gate electrode 170, the inter-layer dielectric layer 150 is configured to have a first dielectric layer sub-portion 151 and a second dielectric layer sub-portion 152. In the direction perpendicular to the first surface 111 of the base substrate 110, the first dielectric layer sub-portion 151 is directly above the gate electrode 170 and has a first thickness d1; and the second dielectric layer sub-portion 152 does not overlap with gate electrode 170 and has a second thickness d2 greater than the first thickness d1.

Therefore, in step S150, the forming the inter-layer dielectric layer 150 can include: forming the inter-layer dielectric layer 150 with a half tone mask or a gray tone mask, so that the inter-layer dielectric layer 150 includes the first dielectric layer sub-portion 151 and the second dielectric layer sub-portion 152.

For example, in a case where the inter-layer dielectric layer 150 is formed with a half tone mask, the half tone mask includes a light-transmitting region, a half-transmitting region (or a partially-transmitting region), and a non-transmitting region; and light transmittance of the light-transmitting region is greater than light transmittance of the half-transmitting region.

Figure 7:
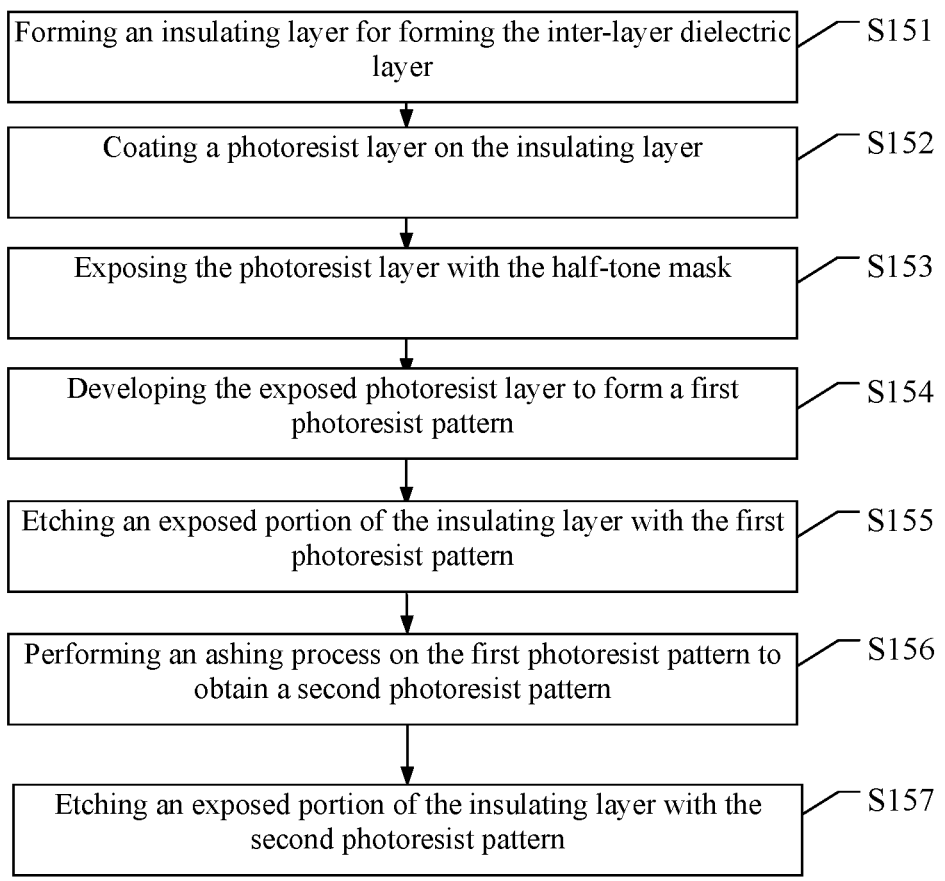
FIG. 7 shows a flow chart of forming an inter-layer dielectric layer according to at least one embodiment of the present disclosure.

In particular, FIG. 7 shows a flow chart of forming an inter-layer dielectric layer according to at least one embodiment of the present disclosure. As shown in FIG. 7, in step S150, the forming the inter-layer dielectric layer 150 by using positive photoresist with a half tone mask can include:

S151: forming an insulating layer for forming the inter-layer dielectric layer;

S152: coating a photoresist layer on the insulating layer;

S153: exposing the photoresist layer with the half tone mask;

S154: developing the exposed photoresist layer to form a first photoresist pattern, the first photoresist pattern including a photoresist completely removed region, a photoresist partial thickness region, and a photoresist full thickness region;

S155: etching an exposed portion of the insulating layer with the first photoresist pattern, to form a via hole running through the insulating layer;

S156: performing an ashing process on the first photoresist pattern to obtain a second photoresist pattern, thereby removing photoresist in the photoresist partial thickness region while retaining a portion of photoresist in the photoresist full thickness region;

S157: etching an exposed portion of the insulating layer with the second photoresist pattern.

In step S151, the insulating layer for forming the inter-layer dielectric layer is formed, for example, by deposition, etc.

In step S153, the exposed photoresist material includes a first exposed portion corresponding to a via hole region, a second exposed portion corresponding to the first dielectric layer sub-portion 151, and a non-exposed portion corresponding to the second dielectric layer sub-portion 152. The light-transmitting region of the half tone mask is used for forming the first exposed portion, and the half-transmitting region of the half tone mask is used for forming the second exposed portion. After development, photoresist in the first exposed portion is completely removed to expose a corresponding portion of the insulating layer, thereby obtaining the photoresist completely removed region; photoresist in the second exposed portion is partially removed, thereby obtaining the photoresist partial thickness region; and photoresist of the non-exposed portion is substantially reserved, thereby obtaining the photoresist full thickness region.

Thus, after the second etching process in step S157, because a portion of the insulating layer that corresponds to the first dielectric layer sub-portion 151 is partially etched in a thickness direction (i.e., a corresponding insulating layer portion is not completely removed), the formed inter-layer dielectric layer can have a thickness of the first dielectric layer sub-portion 151 smaller than that of the second dielectric layer sub-portion 152. For example, a degree of etching in the thickness direction can be controlled by controlling etching time, thereby controlling the thickness of the first dielectric layer sub-portion 151.

Alternatively, in step S153, the photoresist material can be cured with a gray tone mask instead of a half tone mask. The gray tone mask includes a light-transmitting region, a slit region and a non-transmitting region. The slit region includes a slit structure, which weakens an intensity of transmitted light on a principle that interference occurs to the light transmitted through the slit.

In another embodiment, for example, the insulating layer for forming the inter-layer dielectric layer is itself a photosensitive resin material, such as photoresist. For example, the photosensitive resin material is positive photoresist; after coating the photosensitive resin material to form the insulating layer, exposure is performed with, for example, the above-described half tone mask; in the exposure process, a portion of the insulating layer that corresponds to the light-transmitting region of the mask is completely exposed, a portion corresponding to the half-transmitting region of the mask is partially exposed, and a portion corresponding to the non-transmitting region of the mask is not exposed. After development, the unexposed portion in the insulating layer forms the second dielectric layer sub-portion 152, the partially exposed portion forms the first dielectric layer sub-portion 151, and the completely exposed portion is removed to form the via hole, so that the formed inter-layer dielectric layer has a thickness of the first dielectric layer sub-portion 151 smaller than that of the second dielectric layer sub-portion 152.

For another example, the photoresist can also be negative photoresist, and a mask adopted in this case, for example, can be complementary to the above-described mask, so that after exposure and development, the inter-layer dielectric layer having different thicknesses in different regions and the via hole in the inter-layer dielectric layer can also be formed.

The scope of the present disclosure is not limited by the implementation modes as described above, but is determined by the appended claims and equivalent scope thereof.

The invention claimed is:

1. An array substrate, comprising:
   a base substrate;
   a light-shielding portion, formed on a first surface of the base substrate;
   a thin-film transistor, formed on a side of the light-shielding portion away from the base substrate, and comprising an active layer; and
   a capacitor, formed on the first surface of the base substrate, and comprising a first capacitive electrode and a second capacitive electrode,
   wherein the first capacitive electrode and the second capacitive electrode are at least partially arranged opposite to each other in a direction perpendicular to the first surface of the base substrate; the first capacitive electrode is provided in a same layer as the light-shielding portion; at least a portion of an orthogonal projection of the active layer on the first surface of the base substrate is located in an orthogonal projection of the light-shielding portion on the first surface of the base substrate;
   wherein the second capacitive electrode is provided in a same layer as the active layer, and is formed from a same material as the active layer;
   wherein the thin-film transistor further comprises a gate electrode; and the second capacitive electrode is provided in a same layer as the gate electrode and is formed from a same material as the gate electrode;
   wherein the array substrate further comprises:
   a third electrode, wherein;
   the thin-film transistor further comprises a source-drain electrode, the third electrode is provided in a same layer as the source-drain electrode, and is formed from a same material as the source-drain electrode, and
   the third electrode is electrically connected to the first capacitive electrode through a first via hole.

2. The array substrate according to claim 1, wherein the first capacitive electrode is formed of a same conductive material as the light-shielding portion.

3. The array substrate according to claim 2, further comprising:
   a gate line and a data line, the gate line and the data line being respectively electrically connected with the thin-film transistor; and
   a power line, the power line being electrically connected with the first capacitive electrode or the second capacitive electrode, wherein,
   an orthogonal projection of at least one of the first capacitive electrode and the second capacitive electrode on the first surface of the base substrate at least partially overlaps with an orthogonal projection of at least one of the gate line, the data line, and the power line on the first surface of the base substrate.

4. The array substrate according to claim 2, wherein:
   the first capacitive electrode comprises a first complementary portion; the second capacitive electrode comprises a second complementary portion; and a shape of a projection of the first complementary portion on the first surface of the base substrate is complementary to a shape of a projection of the second complementary portion on the first surface of the base substrate.

5. The array substrate according to claim 2, wherein:
   the thin-film transistor further comprises a gate electrode and a source-drain electrode;
   the array substrate further comprises an inter-layer dielectric layer; the inter-layer dielectric layer is provided on a side of the active layer, the gate electrode, and the second capacitive electrode that is away from the base substrate, and comprises a source-drain electrode via hole; and
   the source-drain electrode is formed on a side of the inter-layer dielectric layer that is away from the base substrate, and is electrically connected with the active layer through the source-drain electrode via hole.

6. The array substrate according to claim 5, wherein:
the inter-layer dielectric layer comprises a first dielectric layer sub-portion and a second dielectric layer sub-portion;
an orthogonal projection of the gate electrode on the first surface of the base substrate is within an orthogonal projection of the first dielectric layer sub-portion on the first surface of the base substrate;
an orthogonal projection of the second dielectric layer sub-portion on the first surface of the base substrate does not overlap with the orthogonal projection of the gate electrode on the first surface of the base substrate;
the first dielectric layer sub-portion has a first thickness; and
the second dielectric layer sub-portion has a second thickness, and the first thickness is smaller than the second thickness.

7. The array substrate according to claim 1, wherein:
the third electrode is at least partially opposite to the second capacitive electrode in the direction perpendicular to the first surface of the base substrate.

8. The array substrate according to claim 1, further comprising:
a power line;
wherein, the third electrode is provided in a same layer and formed from a same material as the power line, and the third electrode is electrically connected to the power line.

9. The array substrate according to claim 8, further comprising:
a planarization layer, provided on a side of the inter-layer dielectric layer, the source-drain electrode, and the third electrode that is away from the base substrate.

10. The array substrate according to claim 1, further comprising:
a gate line and a data line, respectively electrically connected with the thin-film transistor; and
a power line, electrically connected with the first capacitive electrode or the second capacitive electrode, wherein,
an orthogonal projection of at least one of the first capacitive electrode and the second capacitive electrode on the first surface of the base substrate at least partially overlaps with an orthogonal projection of at least one of the gate line, the data line, and the power line on the first surface of the base substrate.

11. The array substrate according to claim 1, wherein:
the first capacitive electrode comprises a first complementary portion; the second capacitive electrode comprises a second complementary portion; and a shape of a projection of the first complementary portion on the first surface of the base substrate is complementary to a shape of a projection of the second complementary portion on the first surface of the base substrate.

12. The array substrate according to claim 11, further comprising:
a light emitting element, formed on a side of the planarization layer that is away from the base substrate, wherein, the planarization layer comprises a second via hole, and the light emitting element is electrically connected with the source-drain electrode through the second via hole.

13. The array substrate according to claim 1, wherein:
the thin-film transistor further comprises a gate electrode and a source-drain electrode;

the array substrate further comprises an inter-layer dielectric layer; the inter-layer dielectric layer is provided on a side of the active layer, the gate electrode, and the second capacitive electrode that is away from the base substrate, and comprises a source-drain electrode via hole; and
the source-drain electrode is formed on a side of the inter-layer dielectric layer that is away from the base substrate, and is electrically connected with the active layer through the source-drain electrode via hole.

14. The array substrate according to claim 13, wherein:
the inter-layer dielectric layer comprises a first dielectric layer sub-portion and a second dielectric layer sub-portion;
an orthogonal projection of the gate electrode on the first surface of the base substrate is within an orthogonal projection of the first dielectric layer sub-portion on the first surface of the base substrate;
an orthogonal projection of the second dielectric layer sub-portion on the first surface of the base substrate does not overlap with the orthogonal projection of the gate electrode on the first surface of the base substrate;
the first dielectric layer sub-portion has a first thickness; and
the second dielectric layer sub-portion has a second thickness, and the first thickness is smaller than the second thickness.

15. The array substrate according to claim 1, wherein:
the source-drain electrode comprises a source electrode and a drain electrode; one of the first capacitive electrode and the second capacitive electrode is connected to one of the source electrode and the drain electrode; the other of the first capacitive electrode and the second capacitive electrode is connected to the gate electrode; and the other of the source electrode and the drain electrode is connected to a light emitting element.

16. A display panel, comprising an array substrate, the array substrate comprising:
a base substrate;
a light-shielding portion, formed on a first surface of the base substrate;
a thin-film transistor, formed on a side of the light-shielding portion away from the base substrate, and comprising an active layer; and
a capacitor, formed on the first surface of the base substrate, and comprising a first capacitive electrode and a second capacitive electrode,
wherein the first capacitive electrode and the second capacitive electrode are at least partially arranged opposite to each other in a direction perpendicular to the first surface of the base substrate; the first capacitive electrode is provided in a same layer as the light-shielding portion; at least a portion of an orthogonal projection of the active layer on the first surface of the base substrate is located in an orthogonal projection of the light-shielding portion on the first surface of the base substrate;
wherein the second capacitive electrode is provided in a same layer as the active layer, and is formed from a same material as the active layer;
wherein the thin-film transistor further comprises a gate electrode; and the second capacitive electrode is provided in a same layer as the gate electrode and is formed from a same material as the gate electrode;
wherein the array substrate further comprises:
a third electrode, wherein:

the thin-film transistor further comprises a source-drain electrode, the third electrode is provided in a same layer as the source-drain electrode, and is formed from a same material as the source-drain electrode, and the third electrode is electrically connected to the first capacitive electrode through a first via hole.

17. A fabrication method of an array substrate, comprising:

providing a base substrate comprising a first surface;

forming a light-shielding portion and a first capacitive electrode on the first surface of the base substrate;

forming a thin-film transistor on the light-shielding portion, forming the thin-film transistor comprising forming an active layer; and forming a second capacitive electrode, wherein, the first capacitive electrode and the second capacitive electrode are arranged opposite to each other in a direction perpendicular to the first surface of the base substrate, and at least a portion of an orthogonal projection of the active layer on the first surface of the base substrate is located in an orthogonal projection of the light-shielding portion on the first surface of the base substrate, wherein the second capacitive electrode is provided in a same layer as the active layer, and is formed from a same material as the active layer;

wherein the thin-film transistor further comprises a gate electrode; the second capacitive electrode is provided in a same layer as the gate electrode and is formed from a same material as the gate electrode;

wherein the fabrication method further comprises:

forming a third electrode, wherein:

the thin-film transistor further comprises a source-drain electrode, the third electrode is provided in a same layer as the source-drain electrode, and is formed from a same material as the source-drain electrode, and the third electrode is electrically connected to the first capacitive electrode through a first via hole.

* * * * *